United States Patent
Andreev et al.

(10) Patent No.: US 7,155,688 B2
(45) Date of Patent: Dec. 26, 2006

(54) MEMORY GENERATION AND PLACEMENT

(75) Inventors: Alexandre Andreev, San Jose, CA (US); Ilya V. Neznanov, Moscow (RU); Andrey Nikitin, Moscow (RU); Ranko Scepanovic, Saratoga, CA (US); Igor Vikhliantsev, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 261 days.

(21) Appl. No.: 10/990,589

(22) Filed: Nov. 17, 2004

(65) Prior Publication Data
US 2006/0107247 A1    May 18, 2006

(51) Int. Cl.
*G06F 17/50* (2006.01)
(52) U.S. Cl. .............................. 716/3; 716/4
(58) Field of Classification Search ............ 716/3–5, 716/8
See application file for complete search history.

(56) References Cited

U.S. PATENT DOCUMENTS

| | | | |
|---|---|---|---|
| 5,689,432 A * | 11/1997 | Blaauw et al. ................ | 716/18 |
| 6,360,356 B1 * | 3/2002 | Eng ............................ | 716/18 |
| 6,505,328 B1 * | 1/2003 | Van Ginneken et al. ....... | 716/7 |
| 6,857,110 B1 * | 2/2005 | Rupp et al. .................... | 716/4 |
| 7,069,523 B1 * | 6/2006 | Nation et al. ................. | 716/2 |

* cited by examiner

*Primary Examiner*—Thuan Do
*Assistant Examiner*—Binh Tat
(74) *Attorney, Agent, or Firm*—Luedeka, Neely & Graham, P.C.

(57) ABSTRACT

A memory generation and placement flow system that receives a customer memory design and places the customer memory design within a customizable standardized integrated circuit design. The memory generation and placement flow system includes a memory librarian tool, a memory estimator tool, and a memory placer tool.

5 Claims, 4 Drawing Sheets

MEMORY GENERATION AND PLACEMENT

FIELD

This invention relates to the field of integrated circuit fabrication. More particularly, this invention relates to memory design for integrated circuits.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. However, mapping or placing the memory blocks required by a customer's memory design into the standardized but customizable integrated circuit designs, otherwise variously referred to as slices herein, can be a very difficult task.

What is needed, therefore, is a system that enables the mapping and placement of customer memories into the customizable memory blocks of a standardized integrated circuit design.

SUMMARY

The above and other needs are met by a memory generation and placement flow system that receives a customer memory design and places the customer memory design within a customizable standardized integrated circuit design. A memory librarian tool receives a memory modules list of the customary memory design, and performs a first automatic placement of the memory modules in the customizable standardized integrated circuit design. the librarian tool checks for acceptable placement of the memory modules within the customizable standardized integrated circuit design, and selects an alternate customizable standardized integrated circuit design if the placement is not acceptable, and generates a memory description if the placement is acceptable.

A memory estimator tool receives the memory description generated by the memory librarian tool, and performs a second automatic placement of memories from the memory description in the customizable standardized integrated circuit design. The estimator tool selectively permits manual correction of the placement of the memories in the customizable standardized integrated circuit design, and selectively permits a generation of memories in the memory description as rcells. The estimator tool then performs a third automatic placement of memories in the memory description that are not generated as rcells.

A gate level synthesis tool selectively receives output from the memory estimator tool and produces a gate level netlist. A memory placer tool receives rcell descriptions from the memory estimator tool and optionally the netlist from the gate level synthesis tool, and performs a fourth automatic placement of rcell positions in the customizable standardized integrated circuit design. The placer tool checks for acceptable placement of the rcell positions in the customizable standardized integrated circuit design, and selectively permits manual correction of the placement of the rcells in the customizable standardized integrated circuit design. The estimator tool outputs final memory positions for back end design flow.

In this manner, the job of mapping and placing customer designed memories within a customizable standardized integrated circuit design is accomplished in an effective and efficient manner.

According to another aspect of the invention there is described a method to place a customer memory design within a customizable standardized integrated circuit design. A memory modules list of the customary memory design is received, and a first automatic placement of the memory modules in the customizable standardized integrated circuit design is performed. The memory modules are checked for acceptable placement within the customizable standardized integrated circuit design. An alternate customizable standardized integrated circuit design is selected if the placement is not acceptable, and a memory description is generated if the placement is acceptable.

A second automatic placement of memories from the memory description is performed in the customizable standardized integrated circuit design. Manual correction of the placement of the memories in the customizable standardized integrated circuit design is selectively permitted, as is a generation of memories in the memory description as rcells. A third automatic placement of memories in the memory description that are not generated as rcells is performed, and a fourth automatic placement of rcell positions in the customizable standardized integrated circuit design is also performed. The rcell positions in the customizable standardized integrated circuit design are checked for acceptable placement, and manual correction of the placement of the rcells in the customizable standardized integrated circuit design is selectively permitted. The final memory positions are output for back end design flow.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
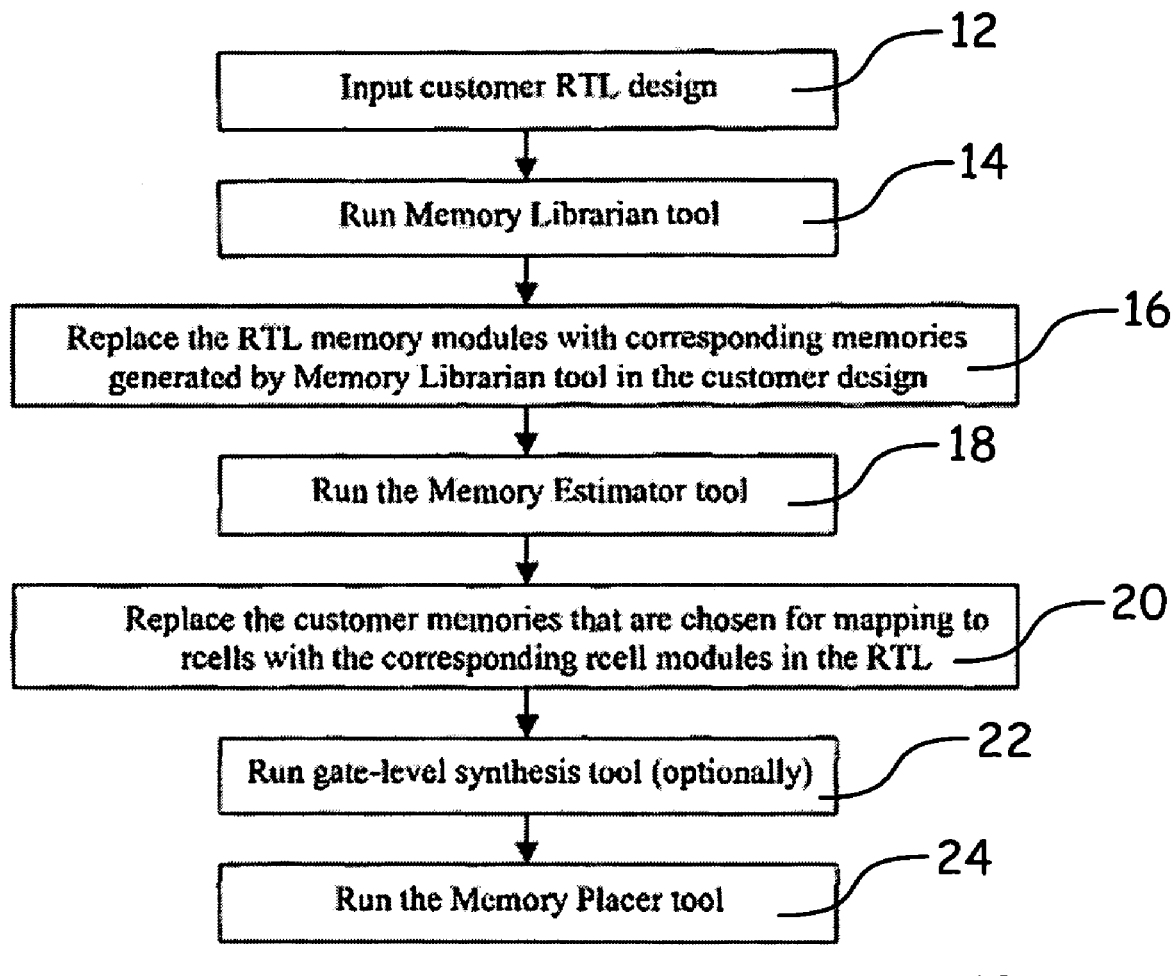
FIG. 1 is a flow chart for a memory generation and placement flow system according to a preferred embodiment of the present invention, including, inter alia, a memory librarian tool, a memory estimator tool, and a memory placer tool.

The memory generation and placement are steps of the design of a memory module, such as in an RRAM integrated circuit. These steps include customer memory generation, instantiating memories into the design, deciding which memories should be assigned to RRAMs and which memories should be mapped to rcells, and finding the desired memory mapping to RRAMs. In addition, memory placement can solve other problems such as the selection of the most appropriate design for a given customer design, and the creation of the floor plan for rcells.

The present invention relates to the description of RRAM memory generation and placement flow, generally referred to herein as placement flow. Placement flow preferably involves the following tools: Memory Librarian, Memory Estimator, and Memory Placer. These tools preferably provide a graphical designer interface to the designer for visualization of the placement flow steps.

The input of the memory placement process is preferably a customer design, usually presented such as by an RTL Verilog and a set of standard RRAM designs. RRAM can be considered as a predefined set of memories with built-in self-testing and self-repairing facilities. In the various embodiments of the present invention, the predefined memories of RRAM are called base memories. The substrates in which such designs are instantiated preferably contain one or more rectangular clusters (called regions) for placing rcells, and some pre diffused sites for placing IO cells and mega cells such as processors, PLLs, etc.

The output of the placement flow is preferably the customer design with final memory placement. Memory placement prepared by the placement flow is passed on to the subsequent steps of the overall integrated circuit design flow. When the final placement for all the design is completed, it is verified on matching timing constraints, etc. If it fails such design testing, the overall flow may return to the placement flow step. If such design testing is successful, then the resulting customer design with placed memories is preferably delivered to the Physical Synthesis Tools (PST) that create the final net list with a physical layout and a Back-End Flow that makes the final RRAM preparations.

The customer design and the physical synthesis tools deal with the customer memories instead of the RRAMs. Each customer memory can be mapped to the different locations of the different RRAMs. The timing model of each customer memory depends on the way this memory is mapped to the RRAMs. If a given customer memory is mapped to a first given RRAM, then it has one timing constraints, if the given customer memory is mapped to a second given RRAM, then it has another timing constraint. In order to provide the physical synthesis tools with correct data on the memory placement and memory timing models, the placement flow preferably has two features, as described below.

First, the placement flow preferably generates the timing models of the worst case (the timing model that corresponds to the worst case of mapping memory to RRAMs). To obtain the worst timing models, all possible ways of mapping the given memory to the RRAMs are examined and the worst case timing model is chosen.

Second, the placement flow preferably presents each customer memory as some virtual memory that has the same list of ports that the customer memory has and each port of the virtual memory is connected to some virtual buffer. For example, for a 111 memory with four words and two bits there is the following standard description:
module MEMORY (ENABLE, CLOCK, DO, DI, A, WE)
input ENABLE, CLOCK, [1:0] DI, [1:0] A, [1:0] WE;
output [1:0] DO;
wire v_ENABLE, v_CLOCK, [1:0] v_DI, [1:0] v_A, [1:0] v_DO;
VIRT_BUF ins_ENABLE (.A(ENABLE), .Z(v_ENABLE));
VIRT_BUF ins_CLOCK (.A(CLOCK), .Z(v_CLOCK));
VIRT_BUF ins_DI_0 (.A(DI[0]), .Z(v_DI[0]));
VIRT_BUF ins_DI_1 (.A(DI[1]), .Z(v_DI[1]));
VIRT_BUF ins_A_0 (.A(A[0]), .Z(v_A[0]));
VIRT_BUF ins_A_1 (.A(A[1]), .Z(v_A[1]));
VIRT_BUF ins_WE_0 (.A(WE[0]), .Z(v_WE[0]));
VIRT_BUF ins_WE_1 (.A(WE[1]), .Z(v_WE[1]));
VIRT_BUF ins_DO_0 (.A(v_DO[0]), .Z(DO[0]));
VIRT_BUF ins_DO_1 (.A(v_DO[1]), .Z(DO[1]));
VIRT_MEMORY ins_virt_memory (.ENABLE(v_ENABLE), .CLOCK(v_CLOCK),
.DO(v_DO), .DI(v_DI), .A(v_A), .WE(v_WE));
endmodule When the placement flow maps the customer memory to the RRAM, it indicates that some RRAM memories are reserved for this customer memory. The list of reserved RRAM memories for each customer memory is delivered by the placement flow to the Back-End Flow. At the same time, the placement flow assigns some coordinates to the virtual memories and virtual buffers for each customer memory. The coordinates of the virtual memory are evaluated as average coordinates of the RRAM memories reserved by the customer memory. The virtual buffers are placed near the RRAM pins that correspond to the pins of RRAM memories reserved by the customer memory. The placement of the virtual buffers and memories are delivered by the placement flow to the physical synthesis tools.

The total scheme of the placement flow 10 is depicted in FIG. 1. The first step is preferably to input the customer RTL design, as given in block 12. This design may contain some memories defined by RTL Verilog modules. Next, the Memory Librarian tool is run, as given in block 14. The Memory Librarian tool preferably generates the memory models for the customer memories. These models preferably include a Verilog description (virtual memory plus connected virtual buffers), Verilog for memory simulation, timing models (including worst case timing model, as mentioned above), and some other data required for other tools of the flow. This process is generally referred to as generating a memory description elsewhere herein.

At this step of the placement flow 10, the designer may select the best suitable standard integrated circuit design for the given set of customer memories. This step doesn't require the input of an entire design, but requires brief information of the memories instantiated in the design. Here the designer can preferably do the preliminary valuation of the standard integrated circuit RRAM utilization by the design memories.

The RTL memory modules are preferably next replaced with the corresponding memories generated by the Memory Librarian tool in the customer design, as given in block 16, and then the Memory Estimator tool is preferably run, as given in block 18. The Memory Estimator tool deals with the RTL customer design and previously selected standard integrated circuit design. It analyzes the design structure and collects the information on the memories instantiated in the customer design. This tool preferably enables a designer to solve three problems, which are: 1) check if all the memories of the customer design can be assigned to slice RRAMs; 2) decide which of the customer memories should be assigned to RRAMs and which of them should be regenerated as rcell memories (rcell memories are memories that are presented by some net list consisting from rcells only); and 3) if it doesn't bring a suitable result, the designer may return to step 14 to choose another standardized integrated circuit design to work with or to generate the other memory models.

The customer memories that are chosen for mapping to rcells are next preferably replaced with the corresponding rcell modules in the RTL customer design, as given in block 20. The designer may then optionally run the gate-level synthesis tool, as given in block 22, and generate a net list for the customer design. Although this step is optional, it is highly desirable for achieving the best quality on the subsequent placement flow 10 steps.

Preferably, the Memory Placer tool in run next, as given in block 24. The Memory Placer inputs the RTL design, and the net list if it was generated in step 22 of the flow. When the Memory Placer starts, some cells of the customer design, such as IOs and mega cells, have preferably already been placed. The Memory Placer tool creates the final assignment of the memories to the RRAMs, otherwise known as the final memory placement. It can also be used for finding the most likely positions for placing rcells on the slice. As a result of its work, the Memory Placer tool provides the physical synthesis tools with the placement of the virtual memories and virtual buffers, and provides the Back-End Flow with the list of RRAM memories reserved by the memories of the customer design.

The different aspects of the placement flow 10 are now discussed in greater detail.

MEMORY LIBRARIAN TOOL

The Memory Librarian deals with brief information about the memory modules that can be instantiated in the customer net list. This information preferably includes basic parameters of the memories, such as the number of bits, the number of words, the type (111, 211, or 222), and the estimated number of instances of this memory in the customer design. The memory information is preferably stored in the memory modules list.

Figure 2:
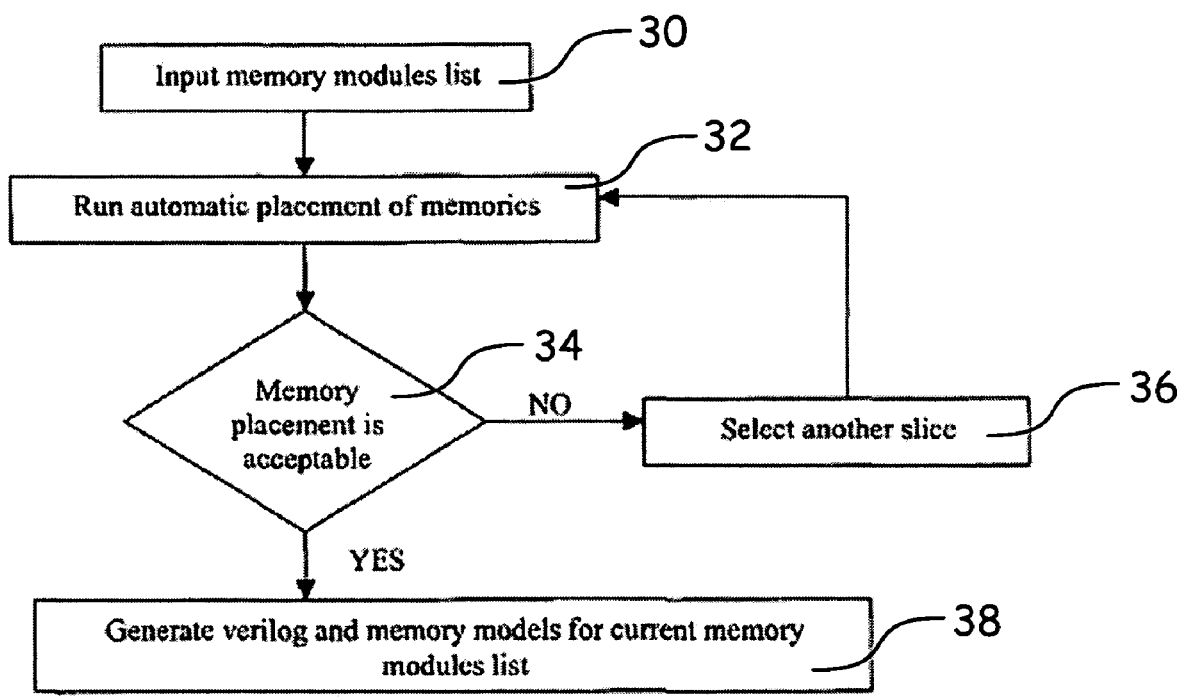
FIG. 2 is a flow chart for the memory librarian tool according to a preferred embodiment of the present invention.
Figure 3:
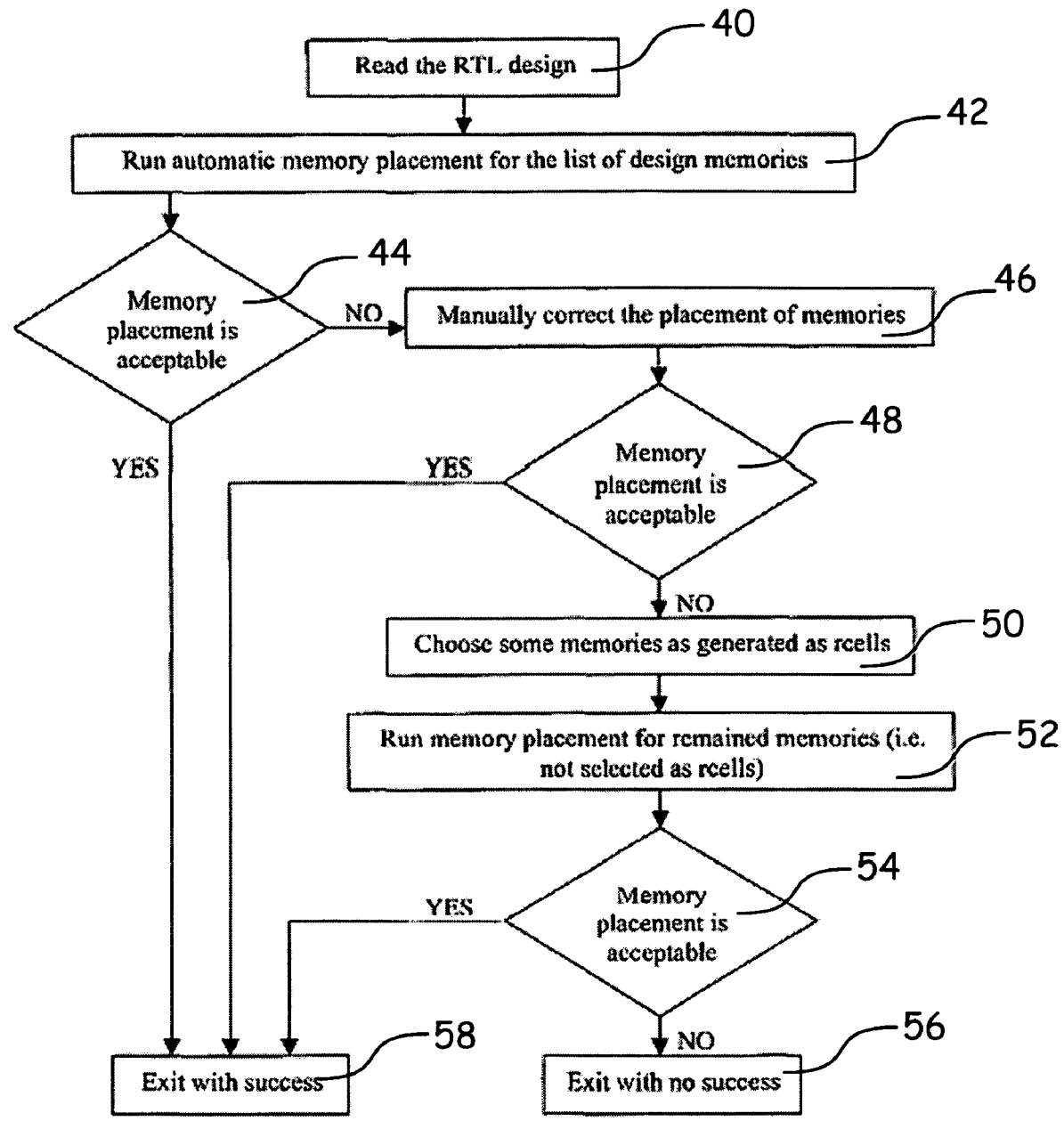
FIG. 3 is a flow chart for the memory estimator tool according to a preferred embodiment of the present invention.

The Memory Librarian tool preferably provides to the designer a graphical interface that shows the graphical representation of the selected standardized, customizable integrated circuit design with RRAMs, regions, and memory mapping into the RRAMs. The user interface preferably allows the designer to see and edit the memory modules list, and to see the utilization of every RRAM, and all the RRAMs in the selected design. A designer can enter the memory modules list with the user interface, as given in block 30 of FIG. 2, and load and store the list in a text file. The designer can preferably also manually move the memories among and inside the RRAMs, and launch the memory placement routine for the current memory modules list, as given in block 32. If the currently selected standardized, customizable integrated circuit design is not suitable, as decided in block 34, such as if there is not enough space for mapping all of the memories on the list, the designer can preferably select another standardized design for customization at this time, as given in block 36.

At the end of the Memory Librarian process, the designer preferably initiates the automatic generation of the memory Verilog description (virtual memory plus connected virtual buffers), Verilog for memory simulation, memory timing models (including worst case timing models), and some other data as may be required for other tools of the design flow, as given in block 38.

At the startup, the Memory Estimator preferably reads the customer design and collects the list of memories instantiated in the design into the memories list, as given in block 40. An automated placement of the memories is then attempted, as given in block 42. The Memory Estimator 18 preferably provides a graphical user interface with a representation of the slice, or in other words of the standardized, customizable integrated circuit design, with RRAMs and memories mapped into these RRAMs. The Memory Estimator preferably checks whether the memories of the list can be successfully mapped into RRAMs of the slice, as given in blocks 44, 48, and 54, and sees the projected results of the mapping. The user interface preferably also shows the memory hierarchy of the design. The designer can preferably choose what memories should be regenerated as rcell modules, as given in block 50, and what should go into RRAMs, as given in block 52. He can manually move memories inside and among RRAMs to adjust the placement, as given in block 46, and try to run the automatic memory assignment for a currently selected set of memories that should go to RRAMs, as given in block 52.

The Memory Estimator tool can be exited with success, as given in block 58, or with no success, as given in block 56. If it finishes with no success 56, it means that the list of custom memories does not fit to the list of RRAMs allowed on the slice, and then the designer preferably returns to block 14 of the placement flow 10 to run the Memory Librarian tool 14.

MEMORY PLACER TOOL

Figure 4:
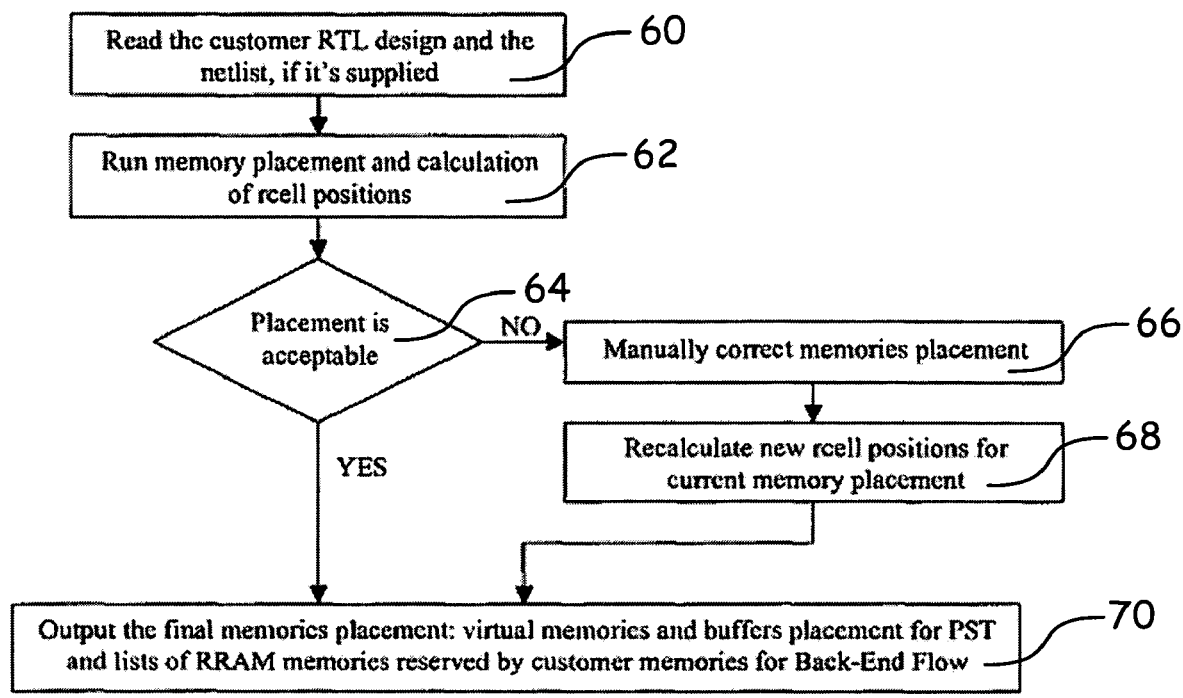
FIG. 4 is a flow chart for the memory placer tool according to a preferred embodiment of the present invention.

The input of the Memory Placer tool 24, as depicted in greater detail in FIG. 4, is the customer design with the predefined coordinates of IOs and mega cells (PLLs, processors, etc.) of the design, as given in block 60. At the startup, this tool 24 processes the memory assignment into RRAMs and, if the net list is supplied, calculates most likelihood positions for rcells of the net list, as given in block 62. The calculation of the rcell and memories positions can be processed in many ways to reach various desirable goals. These goals are, for instance, to restrict the lengths of the wires of the design in order to meet the timing constraints, or to distribute the rcells in a way to avoid the high rcells density in any local area on the slice.

The tool 24 preferably provides a graphical user interface with a graphical representation of the slice, where the designer can see the results of the assignment process. The user interface preferably also shows the memory list and design hierarchy. If the placement generated by the routine 62 is not acceptable, as given in block 64, then the designer can manually move the memories inside and among RRAMs to adjust the result of automatic placement, as given in block 66, and then recalculate the new likelihood rcell positions, as given in block 68. The Memory Placer tool 24 preferably provides as output the final memory placement and other information, as given in block 70.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A memory generation and placement flow system adapted to receive a customer memory design and place the customer memory design within a customizable standardized integrated circuit design, the memory generation and placement flow system comprising:

a memory librarian tool adapted to receive a memory modules list of the customary memory design, perform a first automatic placement of the memory modules in the customizable standardized integrated circuit design, check for acceptable placement of the memory modules within the customizable standardized integrated circuit design, select an alternate customizable standardized integrated circuit design if the placement is not acceptable, and generate a memory description if the placement is acceptable, a memory estimator tool adapted to receive the memory description generated by the memory librarian tool, perform a second automatic placement of memories from the memory description in the customizable standardized integrated circuit design, selectively permit manual correction of the placement of the memories in the customizable standardized integrated circuit design, selectively permit a generation of memories in the memory description as rcells, perform a third automatic placement of memories in the memory description that are not generated as rcells, and a memory placer tool adapted to receive rcell descriptions from the memory estimator tool, perform a fourth automatic placement of rcell positions in the customizable standardized integrated circuit design, check for acceptable placement of the rcell positions in the customizable standardized integrated circuit design, selectively permit manual correction of the placement of the rcells in the customizable standardized integrated circuit design, and output final memory positions for back end design flow.

2. The memory generation and placement flow system of claim 1, further comprising a gate level synthesis tool adapted to generate and provide a netlist to the memory placer tool.

3. A memory generation and placement flow system adapted to receive a customer memory design and place the customer memory design within a customizable standardized integrated circuit design, the memory generation and placement flow system comprising:

a memory librarian tool adapted to receive a memory modules list of the customary memory design, perform a first automatic placement of the memory modules in the customizable standardized integrated circuit design, check for acceptable placement of the memory modules within the customizable standardized integrated circuit design, select an alternate customizable standardized integrated circuit design if the placement is not acceptable, and generate a memory description if the placement is acceptable, a memory estimator tool adapted to receive the memory description generated by the memory librarian tool, perform a second automatic placement of memories from the memory description in the customizable standardized integrated circuit design, selectively permit manual correction of the placement of the memories in the customizable standardized integrated circuit design, selectively permit a generation of memories in the memory description as rcells, perform a third automatic placement of memories in the memory description that are not generated as rcells, a gate level synthesis tool adapted to receive output from the memory estimator tool and produce a gate level netlist, and a memory placer tool adapted to receive rcell descriptions from the memory estimator tool and the netlist from the gate level synthesis tool, perform a fourth automatic placement of rcell positions in the customizable standardized integrated circuit design, check for acceptable placement of the rcell positions in the customizable standardized integrated circuit design, selectively permit manual correction of the placement of the rcells in the customizable standardized integrated circuit design, and output final memory positions for back end design flow.

4. A method to place a customer memory design within a customizable standardized integrated circuit design, the method comprising the steps of:

receiving a memory modules list of the customary memory design, performing a first automatic placement of the memory modules in the customizable standardized integrated circuit design, checking for acceptable placement of the memory modules within the customizable standardized integrated circuit design, selecting an alternate customizable standardized integrated circuit design if the placement is not acceptable, generating a memory description if the placement is acceptable, performing a second automatic placement of memories from the memory description in the customizable standardized integrated circuit design, selectively permitting manual correction of the placement of the memories in the customizable standardized integrated circuit design, selectively permitting a generation of memories in the memory description as rcells, performing a third automatic placement of memories in the memory description that are not generated as rcells, performing a fourth automatic placement of rcell positions in the customizable standardized integrated circuit design, checking for acceptable placement of the rcell positions in the customizable standardized integrated circuit design, selectively permitting manual correction of the placement of the rcells in the customizable standardized integrated circuit design, and outputting final memory positions for back end design flow.

5. The method of claim 4, further comprising the step of generating a netlist prior to performing the fourth automatic placement.

* * * * *